United States Patent
Okuda et al.

(10) Patent No.: US 10,679,332 B2
(45) Date of Patent: Jun. 9, 2020

(54) SOLDER PRINTING INSPECTION DEVICE

(71) Applicant: CKD Corporation, Aichi (JP)

(72) Inventors: Manabu Okuda, Aichi (JP); Nobuyuki Umemura, Aichi (JP)

(73) Assignee: CKD CORPORATION, Aichi (JP)

( * ) Notice: Subject to any disclaimer, the term of this patent is extended or adjusted under 35 U.S.C. 154(b) by 0 days.

(21) Appl. No.: 16/211,920

(22) Filed: Dec. 6, 2018

(65) Prior Publication Data

US 2019/0114764 A1    Apr. 18, 2019

Related U.S. Application Data

(63) Continuation of application No. PCT/JP2017/004569, filed on Feb. 8, 2017.

(30) Foreign Application Priority Data

Jun. 14, 2016    (JP) .................................. 2016-118142

(51) Int. Cl.
*G06T 7/521* (2017.01)
*G06T 7/00* (2017.01)
(Continued)

(52) U.S. Cl.
CPC ........ *G06T 7/0004* (2013.01); *G01B 11/2527* (2013.01); *G01N 21/8851* (2013.01);
(Continued)

(58) Field of Classification Search
CPC ... G06T 7/0004; G06T 7/521; H05K 13/0817; G01B 11/2527; G01B 2210/44;
(Continued)

(56) References Cited

U.S. PATENT DOCUMENTS

2014/0307948 A1* 10/2014 Kamioka .............. G06T 7/0004
382/150

FOREIGN PATENT DOCUMENTS

JP    S63-124944 A    5/1988
JP    H02-100393 A    4/1990
(Continued)

OTHER PUBLICATIONS

Office Action in counterpart Japanese Patent Application No. 2016-118142 dated Jun. 23, 2017 (9 pages).
International Search Report for corresponding International Application No. PCT/JP2017/004569 dated May 9, 2017 (3 pages).
International Preliminary Report on Patentability issued in corresponding International Application No. PCT/JP2017/004569 dated Dec. 27, 2018 (15 pages).

*Primary Examiner* — Eileen M Adams
(74) *Attorney, Agent, or Firm* — Osha Liang LLP

(57) ABSTRACT

A solder printing inspection device that inspects a printing state of solder paste printed on a substrate having a through hole into which a lead terminal of an insertion component is inserted, the solder printing inspection device including: a non-printing face side illuminator that irradiates an inspection range on a non-printing face side with a predetermined light, wherein the non-printing face side is opposite to a printing face side, out of a surface and a rear face of the substrate; a non-printing face side camera that takes an image of the inspection range on the non-printing face side of the substrate irradiated with the predetermined light; and a controller that executes inspection with regard to the solder paste in the inspection range, based on image data with regard to the inspection range on the non-printing face side of the substrate taken by the non-printing face side camera.

4 Claims, 6 Drawing Sheets

(51) Int. Cl.
*G01N 21/956* (2006.01)
*H05K 13/08* (2006.01)
*G01B 11/25* (2006.01)
*G01N 21/88* (2006.01)

(52) U.S. Cl.
CPC .......... *G01N 21/956* (2013.01); *G06T 7/521* (2017.01); *H05K 13/0817* (2018.08); *G01B 2210/44* (2013.01); *G01N 2021/95638* (2013.01); *G01N 2021/95646* (2013.01)

(58) Field of Classification Search
CPC ............. G01N 21/8851; G01N 21/956; G01N 2021/95638; G01N 2021/95646
See application file for complete search history.

(56) References Cited

FOREIGN PATENT DOCUMENTS

| | | |
|---|---|---|
| JP | H11-186738 A | 7/1999 |
| JP | 2006-313100 A | 11/2006 |
| JP | 2007-134582 A | 5/2007 |
| JP | 2007-227624 A | 9/2007 |
| JP | 2010-73763 A | 4/2010 |
| JP | 2011-169791 A | 9/2011 |
| JP | 2013-55296 A | 3/2013 |

\* cited by examiner

SOLDER PRINTING INSPECTION DEVICE

BACKGROUND

Technical Field

The present invention relates to a solder printing inspection device configured to inspect the printing state of solder paste printed on a printed circuit board or more specifically of solder paste filled in through holes.

Description of Related Art

Electronic components mounted on a printed circuit board are roughly divided into two different types of components, i.e., surface mounting components and insertion components. A prior art procedure executes a soldering process with regard to the surface mounting component separately from a soldering process with regard to insertion component.

More specifically, in a conventional production line that mounts two different types of electronic components, i.e., surface mounting components and insertion components, on a printed circuit board, solder paste is printed on the printed circuit board by a solder printing machine (solder printing process). The surface mounting component is subsequently mounted on the printed circuit board (surface mounting process). The printed circuit board is then introduced into a reflow furnace to be subjected to soldering of the surface mounting component (reflow process). Lead wires of the insertion component are subsequently inserted into through holes of the printed circuit board (insertion mounting process). The printed circuit board is then introduced into a solder tank (jet tank or dip tank) to be subjected to soldering of the insertion component (flow process).

A recently proposed technique prints solder paste on a printed circuit board having through holes, subsequently inserts lead terminals of an insertion component into the through holes, and executes soldering of the insertion component by the reflow system. This allows for omission of the conventional flow process with regard to the insertion component in the above production line configured to mount the two different types of electronic components, i.e., the surface mounting components and the insertion components. This simplifies the production process and improves the productivity.

The conventional production line is generally provided with a solder printing inspection device configured to inspect the printing state of solder paste printed on a printed circuit board. For example, a conventionally known configuration of the solder printing inspection device executes three-dimensional measurement on a printing face side of a printed circuit board where solder paste is printed, and determines the good/poor quality of the printing state of solder paste, based on the results of the three-dimensional measurement (as described in, for example, Patent Literature 1).

The conventional technique like Patent Literature 1 described above is, however, applied to solder printing on the premise of surface mounting and executes inspection on the printing face side of the printed circuit board where solder paste is printed. This technique accordingly fails to determine whether solder paste is adequately filled in the through hole.

When the solder paste is not sufficiently filled in the through holes, this is likely to cause various problems, for example, a soldering failure of an insertion component and reduction of the joint strength.

A recently proposed technique measures the weight of a printed circuit board before and after printing of solder paste and calculates a difference of the measured weights as the weight of solder to determine the good/poor quality of the printing state of solder paste (as described in, for example, Patent Literature 2). Another recently proposed technique radiates X ray and inspects the soldering state of an insertion component in the through holes (as described in, for example, Patent Literature 3).

CITATION LIST

Patent Literature

PTL 1: JP 2006-313100A
PTL 2: JP 2007-227624A
PTL 3: JP 2011-169791A

The configuration of Patent Literature 2 described above, however, comprehensively executes the quality determination based on the weight of the entire printed circuit board and accordingly fails to determine whether the solder paste is adequately filled in each of the through holes.

Using the X ray inspection device like Patent Literature 3 is, on the other hand, likely to significantly lower the inspection speed and to have a difficulty in achieving the sufficient resolution as the solder printing inspection device. Additionally, using the X ray inspection device requires the operator to pay much attention to handling and the ambient environment.

SUMMARY

A solder printing inspection device according to one or more embodiments of the present invention is configured to inspect the state of solder paste filled in a through hole more reliably and more easily.

Embodiments of the present invention are described. Functions and advantageous effects according to one or more embodiments of the present invention are also described as appropriate.

A solder printing inspection device according to one or more embodiments of the present invention is configured to inspect a printing state of solder paste that is printed on a substrate having a through hole which a lead terminal of an insertion component is inserted in. The solder printing inspection device comprises at least one non-printing face side illuminator configured to irradiate a predetermined inspection range on a non-printing face side (for example, a rear face side) that is opposite to a printing face side (for example, a surface side) where the solder paste is printed, out of a surface and a rear face of the substrate, with a predetermined light; a non-printing face side imaging unit configured to take an image of the predetermined inspection range on the non-printing face side of the substrate irradiated with the predetermined light; and an inspecting unit configured to execute inspection with regard to the solder paste in the predetermined inspection range, based on image data with regard to the predetermined inspection range on the non-printing face side of the substrate taken by the non-printing face side imaging unit.

The configuration of one or more embodiments of the present invention executes inspection on the non-printing face side that is opposite to the printing face side where solder paste is printed by a solder printing machine, out of the surface and the rear face of the substrate. This configuration individually determines whether the solder paste is adequately filled in each of the through holes by determining, for example, whether the printed solder paste reaches the non-printing face side.

As a result, this configuration enables the solder paste filled in the through hole to be inspected more reliably and more easily. This accordingly improves the inspection accuracy and enhances the inspection speed.

A solder printing inspection device according to one or more embodiments of the present invention is configured to inspect a printing state of solder paste that is printed on a substrate having a through hole which a lead terminal of an insertion component is inserted in. The solder printing inspection device comprises at least one non-printing face side illuminator configured to irradiate a predetermined inspection range on a non-printing face side (for example, a rear face side) that is opposite to a printing face side (for example, a surface side) where the solder paste is printed, out of a surface and a rear face of the substrate, with a predetermined light; a non-printing face side imaging unit configured to take an image of the predetermined inspection range on the non-printing face side of the substrate irradiated with the predetermined light; at least one printing face side illuminator configured to irradiate a predetermined inspection range on the printing face side of the substrate with a predetermined light; a printing face side imaging unit configured to take an image of the predetermined inspection range on the printing face side of the substrate irradiated with the predetermined light; and an inspecting unit configured to execute inspection with regard to the solder paste in the predetermined inspection range, based on image data with regard to the predetermined inspection range on the non-printing face side of the substrate taken by the non-printing face side imaging unit, and to execute inspection with regard to the solder paste in the predetermined inspection range, based on image data with regard to the predetermined inspection range on the printing face side of the substrate taken by the printing face side imaging unit.

The configuration of one or more embodiments of the present invention has similar functions and advantageous effects to those of the embodiments described above. The configuration of one or more embodiments of the present invention additionally executes inspection on the printing face side of the substrate. This allows for comprehensive quality determination based on the two-face inspection and further improves the inspection accuracy.

For example, in the case of a strong pressure of a squeegee or in the case of a large attack angle of the squeegee in the solder printing machine, a leading end of the squeegee enters an opening of a screen mask to wipe out the filled solder paste. This makes it likely that the amount of the solder paste mounted on a land on the printing face side of the substrate becomes insufficient. In such a case, even when the substrate is determined as a non-defective by inspection on the non-printing face side of the substrate, the configuration of one or more embodiments allows the substrate to be determined as a defective by inspection on the printing face side of the substrate. This configuration can thus comprehensively handle the substrate as a defective.

In the case of a weak pressure of the squeegee or in the case of a small attack angle of the squeegee, on the contrary, there is an insufficient force of pressing the solder paste into the opening of the screen mask. This makes it likely that the amount of the solder paste filled in the through hole becomes insufficient and that the solder paste does not sufficiently reach the non-printing face side of the substrate, while an amount of the solder paste enough to compensate for the deficiency is likely to be present on the printing face side. In such a case, even when the substrate is determined as a defective by inspection on the non-printing face side of the substrate, the configuration of one or more embodiments allows the substrate to be determined as a non-defective by inspection on the printing face side of the substrate. This configuration can thus comprehensively handle the substrate as a non-defective.

As described above in "Background", in the production line of the substrate configured to mount not only the insertion components but the surface mounting components, using the solder printing inspection device of one or more embodiments enables a solder printing portion with regard to the surface mounting component to be inspected simultaneously. There is accordingly no need to separately provide a solder printing inspection device for the surface mounting components. Additionally, the configuration of one or more embodiments enables a soldering process of the surface mounting component and a soldering process of the insertion component to be executed simultaneously by a reflow process. As a result, this contributes to simplify the production process and to improve the productivity.

In the solder printing inspection device described above, the non-printing face side illuminator may be configured to radiate light for three-dimensional measurement (for example, patterned light having a striped light intensity distribution) as the predetermined light. The inspecting unit may comprise a three-dimensional calculating unit configured to execute three-dimensional measurement of the solder paste, based on image data taken by the non-printing face side imaging unit that radiates the light for three-dimensional measurement; and a determination unit configured to execute good/poor quality determination of the solder paste, based on a measurement value by the three-dimensional calculating unit.

The configuration of one or more embodiments of the present invention executes inspection by three-dimensional measurement to determine whether the solder paste is adequately filled in the through hole with the higher accuracy, compared with inspection by two-dimensional measurement. As a result, this further improves the inspection accuracy.

In the case of inspection by two-dimensional measurement, for example, when the size (area) of the solder paste in a through hole is smaller than the size (area) of the opening of the through hole in planar view of the non-printing face side of the substrate, the solder paste in the through hole is determined as poor quality. Even in such a case, however, for example, when the protrusion length (height) of the solder paste from the through hole is equal to or longer than a predetermined length or when the amount (volume) of the solder paste protruded from the through hole is equal to or greater than a predetermined amount, the solder paste may be regarded to have a sufficient amount required for adequate soldering. The inspection by three-dimensional measurement can thus determine the solder paste in such a state as good quality.

One example of the three-dimensional measurement method is a phase shift method that executes three-dimensional measurement, based on a plurality of different image data taken, for example, under a plurality of patterned lights having different phases.

In the solder printing inspection device described above, the substrate may be placed such that the non-printing face is arranged to face down. The non-printing face side illuminator may be placed to irradiate the substrate from a lower side with the predetermined light. The non-printing face side imaging unit may be placed to take an image from the lower side of the substrate.

When the substrate is placed such that the non-printing face side is arranged to face up in the inspection device, the solder paste filled in the through hole is likely to move toward the printing face side by its own weight during the inspection process. This is likely to increase the rate of rejection. The configuration of one or more embodiments of the present invention, on the other hand, reduces the possibility of such a trouble.

DETAILED DESCRIPTION OF EMBODIMENTS

The following describes embodiments of a solder printing inspection device. The configuration of a printed circuit board as an object of inspection of the solder printing inspection device is described first with reference to FIGS. 4 to 6. A printed circuit bard 1 that is an object of inspection according to one or more embodiments of the present invention is a type of board with only insertion components mounted thereon.

Figure 4:
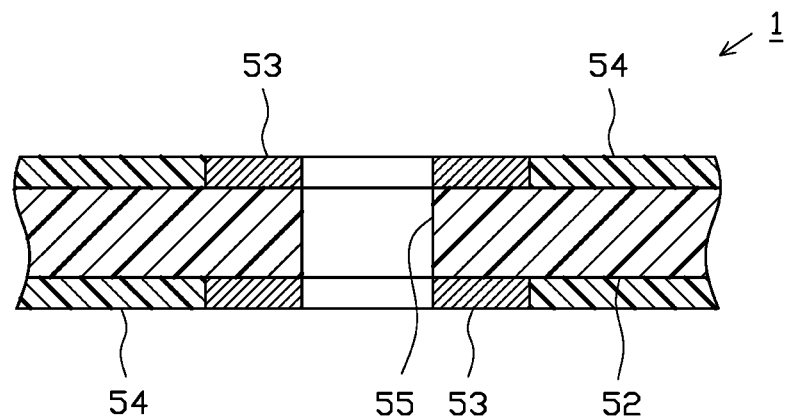
FIG. 4 is a partially enlarged sectional view illustrating the printed circuit board prior to solder printing, according to one or more embodiments of the present invention.
Figure 5:
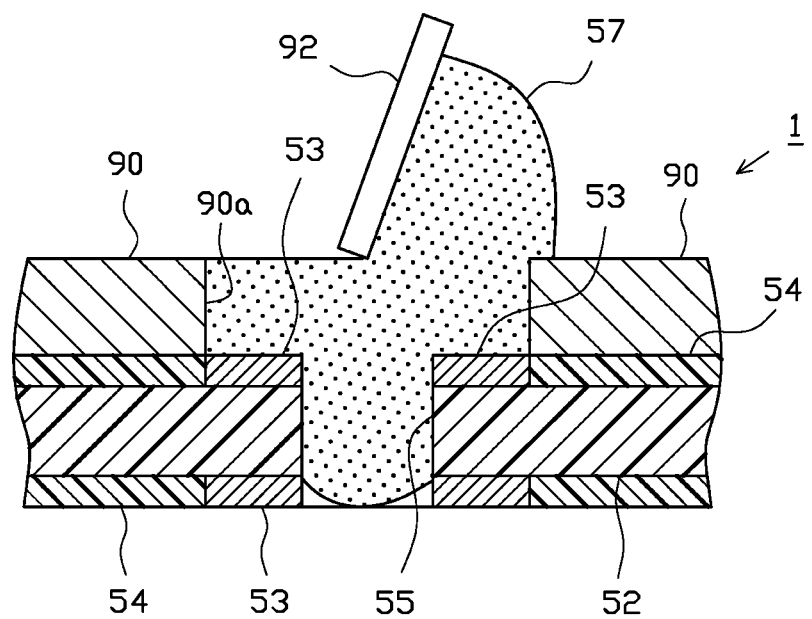
FIG. 5 is a partially enlarged sectional view illustrating the printed circuit board during solder printing, according to one or more embodiments of the present invention.
Figure 6:
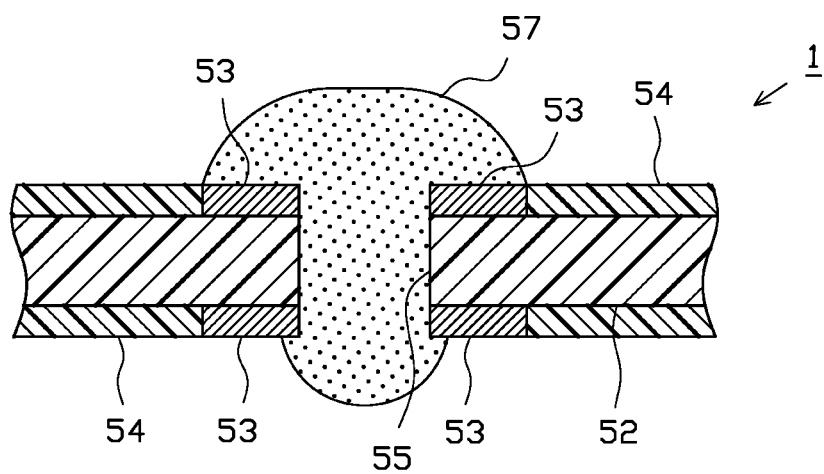
FIG. 6 is a partially enlarged sectional view illustrating the printed circuit board after solder printing, according to one or more embodiments of the present invention.

FIG. 4 is a partially enlarged sectional view illustrating the printed circuit board 1 prior to solder printing. FIG. 5 is a partially enlarged sectional view illustrating the printed circuit board 1 during solder printing. FIG. 6 is a partially enlarged sectional view illustrating the printed circuit board 1 after solder printing.

The printed circuit board 1 is configured such that a pattern (not shown) made of copper foil and lands 53 are formed on both surface and rear face of a flat plate-like base substrate 52 made of, for example, a glass epoxy resin. Portions of the surface and the rear face of the base substrate 52 other than the lands 53 are coated with a resist film 54.

Figure 8:
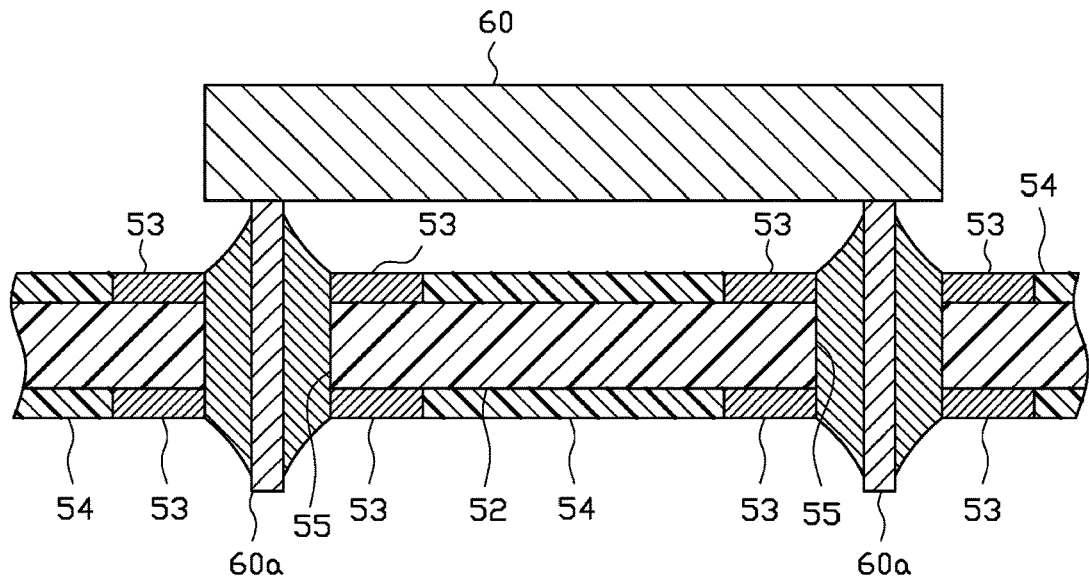
FIG. 8 is a partially enlarged sectional view illustrating the printed circuit board after reflow, according to one or more embodiments of the present invention.

Through holes 55 are formed at predetermined positions of the printed circuit board 1 such as to pass through the lands 53 on the surface and the rear face. The through holes 55 are formed to receive lead terminals 60a of an insertion component 60 inserted therein (as shown in FIG. 8). As shown in FIGS. 5 and 6, solder paste 57 as an object of measurement is printed (mounted and filled) on the lands 53 and in the through holes 55.

Figure 2:
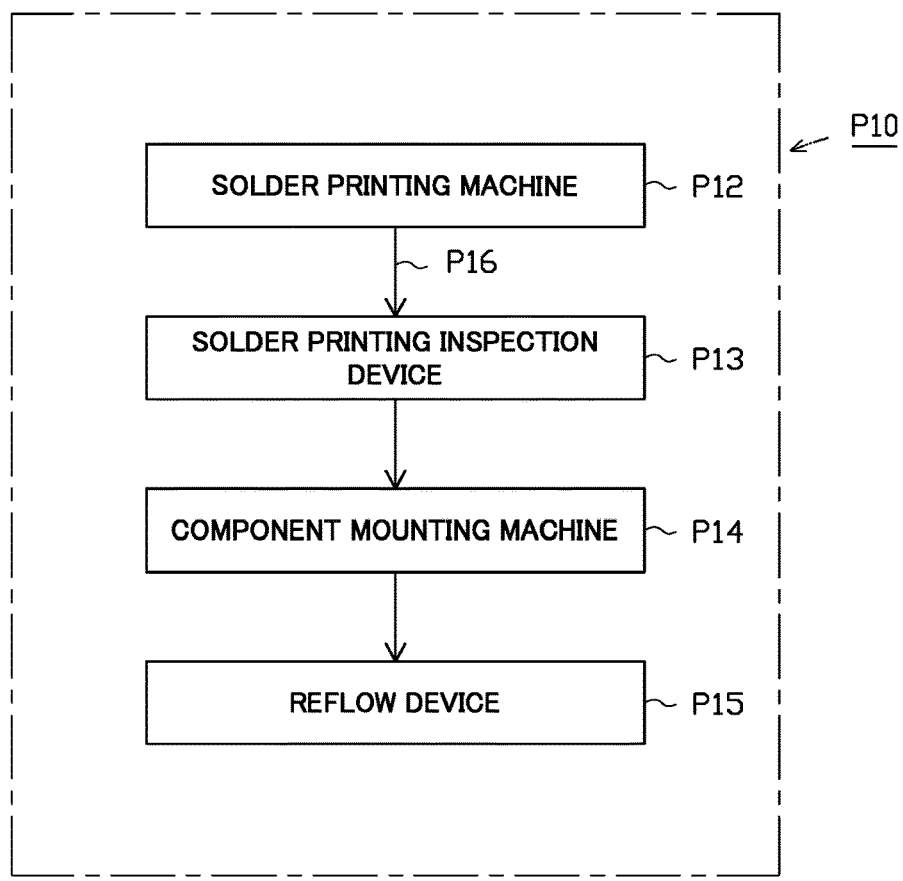
FIG. 2 is a block diagram illustrating the configuration of a production line of a printed circuit board according to one or more embodiments of the present invention.

A production line for manufacturing the printed circuit board 1 is described next with reference to FIG. 2. FIG. 2 is a block diagram illustrating the configuration of a production line P10 of the printed circuit board 1. According to one or more embodiments of the present invention, the production line P10 is set such that the printed circuit board 1 is conveyed rightward when being viewed from the front side.

In the production line P10, a solder printing machine P12, a solder printing inspection device P13, a component mounting machine P14 and a reflow device P15 are placed sequentially from its upstream side (left side in FIG. 2).

The solder printing machine P12 is configured to print (mount and fill) the solder paste 57 on the lands 53 and in the through holes 55 of the printed circuit board 1. For example, as shown in FIG. 5, the solder printing machine P12 includes a flat plate-like screen mask 90 and a squeegee 92 arranged to slide along an upper face of the screen mask 90. The screen mask 90 includes a plurality of openings 90a that are formed corresponding to the respective lands 53 on the surface side of the printed circuit board 1.

In solder printing, the screen mask 90 is first placed over the surface side of the printed circuit board 1. The solder paste 57 is subsequently supplied to the upper face of the screen mask 90. The squeegee 92 is then slid in a predetermined direction along the upper face of the screen mask 90.

This causes the solder paste 57 to be filled in the openings 90a of the screen mask 90. As a result, the solder paste 57 is printed (mounted and filled) on the lands 53 and in the through holes 55. Finally, the screen mask 90 is separated from the printed circuit board 1, and the solder paste 57 is taken out from the openings 90a. This completes solder printing.

The solder printing inspection device P13 is configured to inspect the state of the solder paste 57 printed as described above. The details of the solder printing inspection device P13 will be described later.

The component mounting machine P14 is configured to insert the lead terminals 60a of the insertion component 60 into the through holes 55 that are filled with the solder paste 57.

The reflow device P15 is configured to heat and melt the solder paste 57 and to solder joint (solder) the lands 53 with the lead terminals 60a of the insertion component 60 (as shown in FIG. 8). FIG. 8 is a partially enlarged sectional view illustrating the printed circuit board 1 after reflow.

A conveyor P16 configured to convey the printed circuit board 1 or the like is provided between respective devices, for example, between the solder printing machine P12 and the solder printing inspection device P13 on the production line P10 (as shown in FIG. 2). A branching unit is provided between the solder printing inspection device P13 and the component mounting machine P14, although not being illustrated. The printed circuit board 1 determined as a non-defective by the solder printing inspection device P13 is guided to the component mounting machine P14 on the downstream side, whereas the printed circuit board 1 determined as a defective is discharged to a defective storage by the branching unit.

Figure 1:
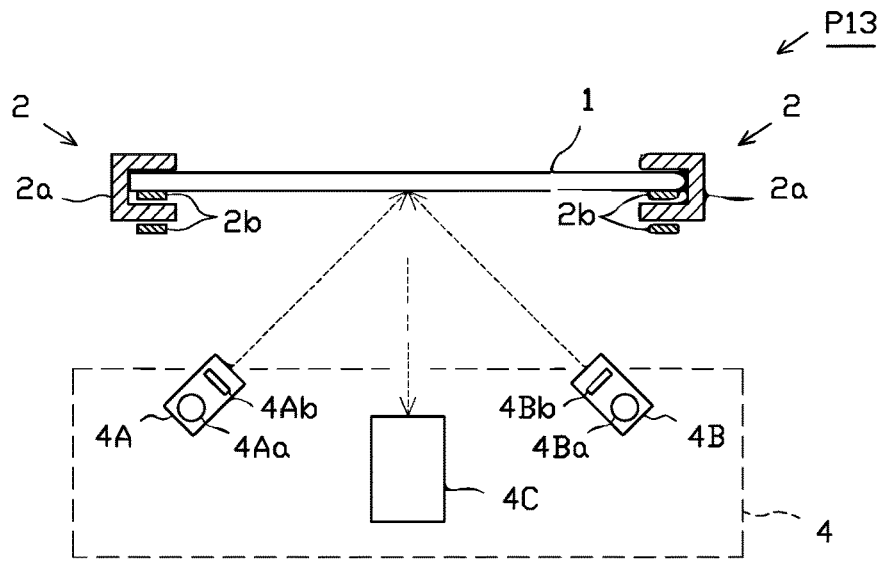
FIG. 1 is a schematic configuration diagram schematically illustrating a solder printing inspection device according to one or more embodiments of the present invention.

The following describes the configuration of the solder printing inspection device P13 in detail with reference to FIG. 1. FIG. 1 is a schematic configuration diagram schematically illustrating the solder printing inspection device P13.

Figure 3:
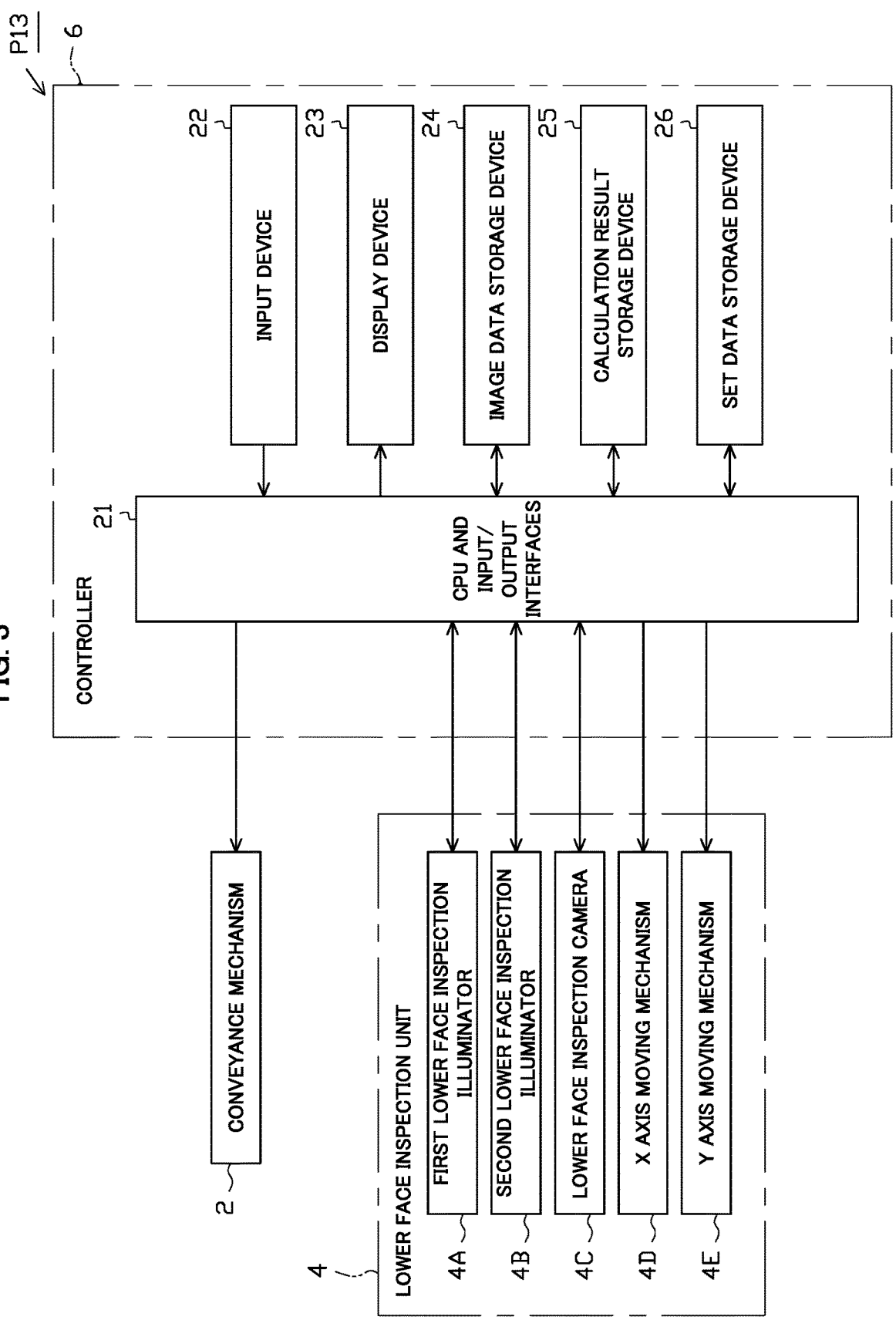
FIG. 3 is a block diagram illustrating the electrical configuration of the solder printing inspection device according to one or more embodiments of the present invention.

The solder printing inspection device P13 includes a conveyance mechanism 2 configured to, for example, convey and position the printed circuit board 1; a lower face inspection unit 4 configured to inspect a lower face (rear face) side of the printed circuit board 1; and a controller 6 configured to execute various controls, image processing and arithmetic processing in the solder printing inspection device P13 including drive control of the conveyance mechanism 2 and the lower face inspection unit 4 (as shown in FIG. 3). The controller 6 is configured as the inspecting unit according to one or more embodiments of the present invention.

The conveyance mechanism 2 includes a pair of conveying rails 2a placed along a conveying direction of the printed circuit board 1, an endless conveyor belt 2b placed to be rotatable relative to the respective conveying rails 2a, a drive unit (not shown) such as a motor configured to drive the conveyor belt 2b, and a chuck mechanism (not shown) configured to position the printed circuit board 1 at a predetermined position, and is driven and controlled by the controller 6.

Under the configuration described above, the printed circuit board 1 carried into the solder printing inspection device P13 is placed on the conveyor belt 2b with respective edges of the printed circuit board 1 in a width direction perpendicular to the conveying direction inserted into the respective conveying rails 2a. The conveyor belt 2b starts operation to convey the printed circuit board 1 to a predetermined inspection position. When the printed circuit board 1 reaches the inspection position, the conveyor belt 2b stops, and the chuck mechanism operates. The operation of this chuck mechanism presses up the conveyor belt 2b, and the respective edges of the printed circuit board 1 are held by the conveyor belt 2b and the upper sides of the conveying rails 2a. The printed circuit board 1 is accordingly positioned and fixed at the inspection position. After termination of inspection, the fixation by the chuck mechanism is released, and the conveyor belt 2b starts operation. This causes the printed circuit board 1 to be carried out from the solder printing inspection device P13. The configuration of the conveyance mechanism 2 is not limited to the configuration described above, but another configuration may be employed alternatively.

The lower face inspection unit 4 is placed below the conveying rails 2a (conveyance path of the printed circuit board 1). The lower face inspection unit 4 includes a first lower face inspection illuminator 4A and a second lower face inspection illuminator 4B serving as the non-printing face side irradiator to irradiate a predetermined inspection range on the lower face of the printed circuit board 1 obliquely upward with a predetermined light for three-dimensional measurement (a patterned light having a striped light intensity distribution); a lower face inspection camera 4C serving as the non-printing face side imaging unit to take an image of the predetermined inspection range on the lower face of the printed circuit board 1 from immediately below; an X axis moving mechanism 4D configured to allow for a move in an X-axis direction (shown in FIG. 3); and a Y axis moving mechanism 4E configured to allow for a move in a Y-axis direction (shown in FIG. 3), and is driven and controlled by the controller 6.

The "inspection range" on the lower face of the printed circuit board 1 denotes one area among a plurality of areas set in advance on the lower face of the printed circuit board 1, in terms of the size of an imaging visual field (imaging range) of the lower face inspection camera 4C as one unit.

The controller 6 drives and controls the X axis moving mechanism 4D and the Y axis moving mechanism 4E to move the lower face inspection unit 4 to a location below an arbitrary inspection range on the lower face of the printed circuit board 1 that is positioned and fixed at the inspection position. The lower face inspection unit 4 is successively moved to a plurality of inspection ranges set on the lower face of the printed circuit board 1 and executes inspection with regard to the respective inspection ranges, so as to implement inspection of the entire lower face of the printed circuit board 1.

The first lower face inspection illuminator 4A includes a first light source 4Aa configured to emit a predetermined light; and a first liquid crystal shutter 4Ab configured to form a first grating that converts the light emitted from the first light source 4Aa into a first patterned light having a striped light intensity distribution, and is driven and controlled by the controller 6.

The second lower face inspection illuminator 4B includes a second light source 4Ba configured to emit a predetermined light; and a second liquid crystal shutter 4Bb configured to form a second grating that converts the light emitted from the second light source 4Ba into a second patterned light having a striped light intensity distribution, and is driven and controlled by the controller 6.

Under the configuration described above, each of the lights emitted from the respective light sources 4Aa and 4Ba is guided to a condenser lens (not shown) to be converted to parallel light, is guided to a projection lens (not shown) via the liquid crystal shutter 4Ab or 4Bb, and is projected as the patterned light on the printed circuit board 1. The configuration of one or more embodiments of the present invention further executes switchover control of the liquid crystal shutters 4Ab and 4Bb to shift the phase of each patterned light by every ¼ pitch.

Using the liquid crystal shutters 4Ab and 4Bb as the grating ensures irradiation of the patterned light having a substantially ideal sinusoidal waveform. This configuration improves the measurement resolution of three-dimensional measurement. This configuration also provides electrical phase shift control of the patterned light and thereby achieves downsizing of the device.

The lower face inspection camera 4C is configured to include a lens, an imaging element and the like. According to one or more embodiments of the present invention, a CCD sensor is employed as the imaging element. The imaging element is, however, not limited to the CCD sensor, and another imaging element such as a CMOS sensor may be employed alternatively.

The lower face inspection camera 4C is driven and controlled by the controller 6. More specifically, the controller 6 executes an imaging process with the lower face inspection camera 4C in synchronism with an irradiation process with the respective lower face inspection illuminators 4A and 4B.

Image data taken by the lower face inspection camera 4C is converted into a digital signal inside of the lower face inspection camera 4C, is transferred in the form of the digital signal to the controller 6, and is stored in an image data storage device 24 described later. The controller 6 executes, for example, image processing and arithmetic processing, based on the image data, as described later.

The following describes the electrical configuration of the controller 6. As shown in FIG. 3, the controller 6 includes a CPU and input/output interfaces 21 (hereinafter referred to as "CPU and the like 21") configured to control the entire solder printing inspection device P13; an input drive 22 serving as the "input unit" comprised of, for example, a keyboard, a mouse and a touch panel; a display device 23 serving as the "display unit" having a display screen such as a CRT or a liquid crystal display; an image data storage device 24 configured to store, for example, image data taken by the lower face inspection camera 4C; a calculation result storage device 25 configured to store results of various calculations; and a set data storage device 26 configured to store in advance various information such as gerber data. These devices 22 to 26 are electrically connected with the CPU and the like 21.

The following describes in detail an inspection routine of the printed circuit board 1 executed by the solder printing inspection device P13. This inspection routine is executed by the controller 6 (CPU and the like 21).

In inspection with regard to each inspection range on the lower face side of the printed circuit board 1, the inspection routine of one or more embodiments of the present invention executes an image obtaining process that executes four imaging processes under the first patterned light having different phases with changing the phase of the first patterned light radiated from the first lower face inspection illuminator 4A and subsequently executes four imaging processes under the second patterned light having different phases with changing the phase of the second patterned light radiated from the second lower face inspection illuminator 4B, so as to obtain a total of eight different image data. This image obtaining process is described in detail below.

As described above, when the printed circuit board 1 carried into the solder printing inspection device P13 is positioned and fixed at a predetermined inspection position, the controller 6 first drives and controls the X axis moving mechanism 4D and the Y axis moving mechanism 4E to move the lower face inspection unit 4 and to adjust the imaging visual field (imaging range) of the lower face inspection camera 4C to a predetermined inspection range on the lower face of the printed circuit board 1.

The controller 6 also executes switchover control of the liquid crystal shutters 4Ab and 4Bb of the respective lower face inspection illuminators 4A and 4B to set the positions of the first grating and the second grating formed by the respective liquid crystal shutters 4Ab and 4Bb to predetermined reference positions.

On completion of the switchover and the setting of the first grating and the second grating, the controller 6 causes light emission from the first light source 4Aa of the first lower face inspection illuminator 4A to radiate the first patterned light and drives and controls the lower face inspection camera 4C to execute a first imaging process under the first patterned light.

Simultaneously with termination of the first imaging process under the first patterned light, the controller 6 turns off the first light source 4Aa of the first lower face inspection illuminator 4A and executes a changeover process of the first liquid crystal shutter 4Ab. More specifically, the controller 6 changes over and sets the position of the first grating formed by the first liquid crystal shutter 4Ab from the reference position to a second position having the phase of the first patterned light shifted by ¼ pitch (90 degrees).

On completion of the changeover and the setting of the first grating, the controller 6 causes light emission from the light source 4Aa of the first lower face inspection illuminator 4A to radiate the first patterned light and drives and controls the lower face inspection camera 4C to execute a second imaging process under the first patterned light. Four different image data under the first patterned light have the phases differing by 90 degrees each are obtained by repeatedly executing this series of processing.

The controller 6 subsequently causes light emission from the second light source 4Ba of the second lower face inspection illuminator 4B to radiate the second patterned light and drives and controls the lower face inspection camera 4C to execute a first imaging process under the second patterned light.

Simultaneously with termination of the first imaging process under the second patterned light, the controller 6 turns off the second light source 4Ba of the second lower face inspection illuminator 4B and executes a changeover process of the second liquid crystal shutter 4Bb. More specifically, the controller 6 changes over and sets the position of the second grating formed by the second liquid crystal shutter 4Bb from the reference position to a second position having the phase of the second patterned light shifted by ¼ pitch (90 degrees).

On completion of the changeover and the setting of the second grating, the controller 6 causes light emission from the light source 4Ba of the second lower face inspection illuminator 4B to radiate the second patterned light and drives and controls the lower face inspection camera 4C to execute a second imaging process under the second patterned light. Four different image data under the second patterned light have the phases differing by 90 degrees each are obtained by repeatedly executing this series of processing.

The controller 6 then executes three-dimensional measurement (height measurement) of the solder paste 57 by the known phase shift method, based on the four different image data taken under each of the patterned lights and stores the results of measurement into the calculation result storage device 25. The three-dimensional calculation unit is configured by the function executing this series of processing according to one or more embodiments of the present invention. The configuration of one or more embodiments of the present invention executes three-dimensional measurement by radiating the patterned lights from two different directions. This prevents the occurrence of any shade portion that is not irradiated with any patterned light.

The controller 6 subsequently executes a quality determination process of the solder paste 57 filled in each of the through holes 55, based on the results of three-dimensional measurement. The determination unit is configured by the function executing this series of processing according to one or more embodiments of the present invention.

For example, according to one or more embodiments of the present invention, the controller 6 first detects a printing range of the solder paste 57 protruded from a reference plane (for example, the land 53 on the rear face of the printed circuit board 1), based on the measurement result described above and integrates the heights at respective locations in the detected range, so as to calculate the volume of the solder paste 57 protruded from the reference plane.

The controller 6 subsequently compares the volume data of the solder paste 57 obtained as described above with reference data stored in advance in the set data storage device 26 and determines the good/poor quality of the solder paste 57 filled in each of the through holes 55, based on whether the result of this comparison is within an allowable range.

Figure 7:
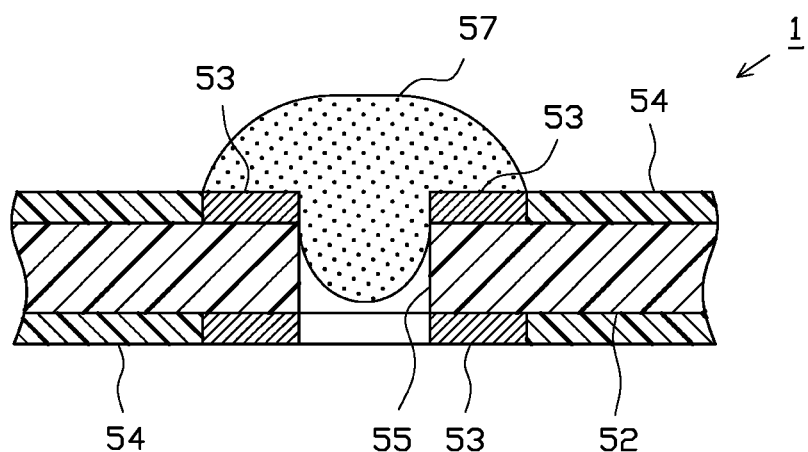
FIG. 7 is a partially enlarged sectional view illustrating the printed circuit board in solder printing failure, according to one or more embodiments of the present invention.

For example, the solder paste 57 that is protruded from the through hole 55 and that is in contact with the land 53 on the rear face of the printed circuit board 1 as shown in FIG. 6 is "determined as good quality". The solder paste 57 that is not protruded from the through hole 55 and that is not in contact with the land 53 on the rear face of the printed circuit board 1 as shown in FIG. 7 is "determined as poor quality".

During this series of processing, the controller 6 moves the lower face inspection unit 4 to a next inspection range. The above series of processing is then repeatedly executed with regard to all inspection ranges over the lower face of the printed circuit board 1. This completes inspection of the entire lower face of the printed circuit board 1.

The controller 6 determines the "good quality" or the "poor quality" with regard to each of the through holes 55. When the state of the solder paste 57 is determined as "good quality" with regard to all the through holes 55 on the lower face of the printed circuit board 1, the printed circuit board 1 is determined as a "non-defective". When the state of the solder paste 57 is determined as "poor quality" with regard to even one of the through holes 55, the printed circuit board 1 is determined as a "defective" on the whole.

As described above, the printed circuit board 1 determined as a non-defective is guided to the component mounting machine P14 on the downstream side, whereas the printed circuit board 1 determined as a defective is discharged to the defective storage.

As described above in detail, one or more embodiments of the present invention execute inspection on the non-printing face side that is opposite to the printing face side where the solder paste 57 is printed by the solder printing machine P12, out of the surface and the rear face of the printed circuit board 1, and thereby individually determines whether the solder paste 57 is adequately filled in each of the through holes 55 by determining, for example, whether the printed solder paste 57 reaches the non-printing face side.

As a result, this configuration enables the solder paste 57 filled in the through holes 55 to be inspected more reliably and more easily. This accordingly improves the inspection accuracy and enhances the inspection speed.

One or more embodiments of the present invention execute inspection by three-dimensional measurement to determine whether the solder paste 57 is adequately filled in the through holes 55 with the higher accuracy, compared with inspection by two-dimensional measurement. As a result, this further improves the inspection accuracy.

In the case of inspection by two-dimensional measurement, for example, when the size (area) of the solder paste 57 in a through hole 55 is smaller than the size (area) of the opening of the through hole 55 in planar view of the rear face side of the printed circuit board 1, the solder paste 57 in the through hole 55 is determined as poor quality. Even in such a case, however, for example, when the protrusion length (height) of the solder paste 57 from the through hole 55 is equal to or longer than a predetermined length or when the amount (volume) of the solder paste 57 protruded from the through hole 55 is equal to or greater than a predetermined amount, the solder paste 57 may be regarded to have a sufficient amount required for adequate soldering. The inspection by three-dimensional measurement can thus determine the solder paste 57 in such a state as good quality.

Figure 9:
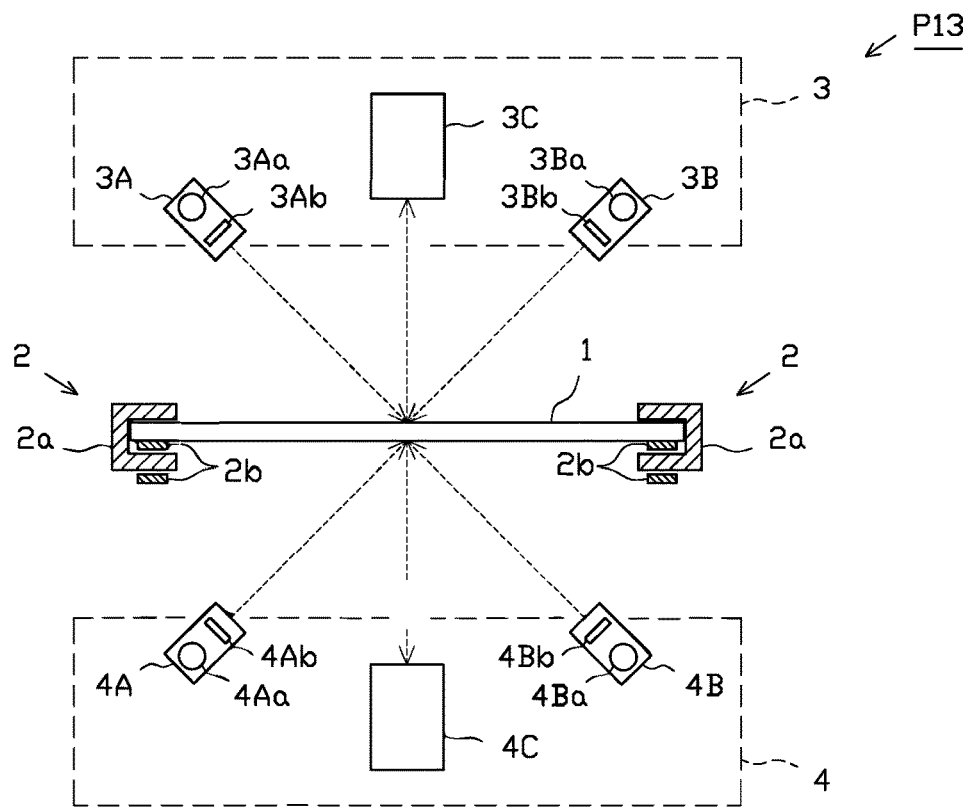
FIG. 9 is a schematic configuration diagram schematically illustrating a solder printing inspection device according to one or more embodiments of the present invention.
Figure 10:
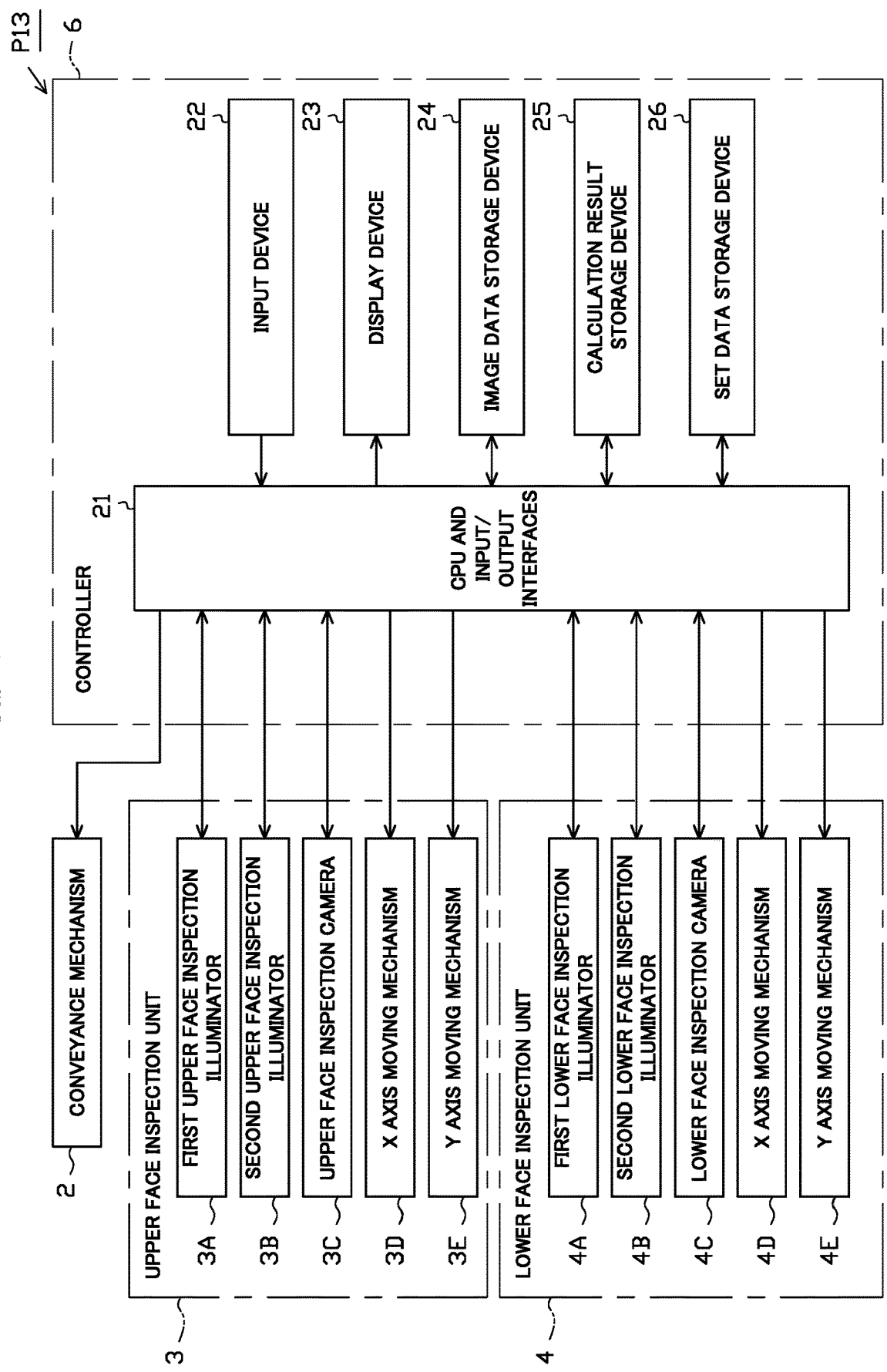
FIG. 10 is a block diagram illustrating the electrical configuration of the solder printing inspection device according to one or more embodiments of the present invention.

The following describes one or more embodiments of the present invention with reference to FIGS. 9 and 10. The like components to those of the aforementioned embodiments are expressed by the like reference signs, and their detailed description is omitted. FIG. 9 is a schematic configuration diagram schematically illustrating a solder printing inspection device P13 according to one or more embodiments of the present invention. FIG. 10 is a block diagram illustrating the electrical configuration of the solder printing inspection device P13 according to one or more embodiments of the present invention.

A printed circuit board 1 that is an object of inspection according to one or more embodiments of the present invention is a type of board with two different types of electronic components, i.e., surface mounting components (not shown) and insertion components 60 mounted thereon.

Like the aforementioned embodiments, a solder printing machine P12, a solder printing inspection device P13, a component mounting machine P14 and a reflow device P15 are placed in a production line P10 according to one or more embodiments of the present invention.

The solder printing inspection device P13 according to one or more embodiments of the present invention is, however, configured to inspect the printing state of the solder paste 57 on both the surface and the rear face (both the upper face and the lower face) of the printed circuit board 1. The details of the solder printing inspection device P13 will be described later.

The component mounting machine P14 includes a mechanism (mounter) of mounting the surface mounting component on the solder paste 57 printed on the land 53 and a mechanism (inserter) of inserting lead terminals 60a of the insertion component 60 in through holes 55 filled with the solder paste 57.

The reflow device P15 is configured to heat and melt the solder paste 57 and to solder the surface mounting component with the land 53 and solder the insertion component 60 with the land 53.

The following describes the configuration of the solder printing inspection device P13 according to one or more embodiments of the present invention in detail. As shown in FIG. 9, the solder printing inspection device P13 includes a conveyance mechanism 2 configured to, for example, convey and position the printed circuit board 1; an upper face inspection unit 3 configured to inspect an upper face (surface) side of the printed circuit board 1; a lower face inspection unit 4 configured to inspect a lower face (rear face) side of the printed circuit board 1; and a controller 6 configured to execute various controls, image processing and arithmetic processing in the solder printing inspection device P13 including drive control of the conveyance mechanism 2 and the respective inspection units 3 and 4 (as shown in FIG. 10).

The upper face inspection unit 3 is placed above the conveying rails 2a (conveyance path of the printed circuit board 1), and the lower face inspection unit 4 is placed below the conveying rails 2a (conveyance path of the printed circuit board 1).

The upper face inspection unit 3 includes a first upper face inspection illuminator 3A and a second upper face inspection illuminator 3B serving as the printing face side irradiator to irradiate a predetermined inspection range on the upper face of the printed circuit board 1 obliquely downward with a predetermined light for three-dimensional measurement (a patterned light having a striped light intensity distribution); an upper face inspection camera 3C serving as the printing face side imaging unit to take an image of the predetermined inspection range on the upper face of the printed circuit board 1 from immediately above; an X axis moving mechanism 3D configured to allow for a move in the X-axis direction (shown in FIG. 10); and a Y axis moving mechanism 3E configured to allow for a move in the Y-axis direction (shown in FIG. 10), and is driven and controlled by the controller 6.

The controller 6 drives and controls the X axis moving mechanism 3D and the Y axis moving mechanism 3E to move the upper face inspection unit 3 to a location above an arbitrary inspection range on the upper face of the printed circuit board 1 that is positioned and fixed at an inspection position. The upper face inspection unit 3 is successively moved to a plurality of inspection ranges set on the upper face of the printed circuit board 1 and executes inspection with regard to the respective inspection ranges, so as to implement inspection of the entire upper face of the printed circuit board 1.

The first upper face inspection illuminator 3A includes a first light source 3Aa configured to emit a predetermined light; and a first liquid crystal shutter 3Ab configured to form a first grating that converts the light emitted from the first light source 3Aa into a first patterned light having a striped light intensity distribution, and is driven and controlled by the controller 6.

The second upper face inspection illuminator 3B includes a second light source 3Ba configured to emit a predetermined light; and a second liquid crystal shutter 3Bb configured to form a second grating that converts the light emitted from the second light source 3Ba into a second patterned light having a striped light intensity distribution, and is driven and controlled by the controller 6.

The upper face inspection camera 3C is configured to include a lens, an imaging element and the like and is driven and controlled by the controller 6. Image data taken by the upper face inspection camera 3C is stored in the image data storage device 24 of the controller 6. The "inspection range" on the upper face of the printed circuit board 1 denotes one area among a plurality of areas set in advance on the upper face of the printed circuit board 1, in terms of the size of an imaging visual field (imaging range) of the upper face inspection camera 3C as one unit.

The lower face inspection unit 4 includes a first lower face inspection illuminator 4A and a second lower face inspection illuminator 4B serving as the non-printing face side irradiator to irradiate a predetermined inspection range on the lower face of the printed circuit board 1 obliquely upward with a predetermined light for three-dimensional measurement (a patterned light having a striped light intensity distribution); a lower face inspection camera 4C serving as the non-printing face side imaging unit to take an image of the predetermined inspection range on the lower face of the printed circuit board 1 from immediately below; an X axis moving mechanism 4D configured to allow for a move in the X-axis direction (shown in FIG. 10); and a Y axis moving mechanism 4E configured to allow for a move in the Y-axis direction (shown in FIG. 10), and is driven and controlled by the controller 6.

The controller 6 drives and controls the X axis moving mechanism 4D and the Y axis moving mechanism 4E to move the lower face inspection unit 4 to a location below an arbitrary inspection range on the lower face of the printed circuit board 1 that is positioned and fixed at the inspection position. The lower face inspection unit 4 is successively moved to a plurality of inspection ranges set on the lower face of the printed circuit board 1 and executes inspection with regard to the respective inspection ranges, so as to implement inspection of the entire lower face of the printed circuit board 1.

The first lower face inspection illuminator 4A includes a first light source 4Aa configured to emit a predetermined light; and a first liquid crystal shutter 4Ab configured to form a first grating that converts the light emitted from the first light source 4Aa into a first patterned light having a striped light intensity distribution, and is driven and controlled by the controller 6.

The second lower face inspection illuminator 4B includes a second light source 4Ba configured to emit a predetermined light; and a second liquid crystal shutter 4Bb configured to form a second grating that converts the light emitted from the second light source 4Ba into a second patterned light having a striped light intensity distribution, and is driven and controlled by the controller 6.

The lower face inspection camera 4C is configured to include a lens, an imaging element and the like and is driven and controlled by the controller 6. Image data taken by the lower face inspection camera 4C is stored in the image data storage device 24 of the controller 6. The "inspection range" on the lower face of the printed circuit board 1 denotes one area among a plurality of areas set in advance on the lower face of the printed circuit board 1, in terms of the size of an imaging visual field (imaging range) of the lower face inspection camera 4C as one unit.

The following describes an inspection routine of the printed circuit board 1 executed by the solder printing inspection device P13 according to one or more embodiments of the present invention.

In inspection with regard to each inspection range on the upper face side of the printed circuit board 1, the inspection routine of one or more embodiments of the present invention executes an image obtaining process that executes four imaging processes under the first patterned light having different phases with changing the phase of the first patterned light radiated from the first upper face inspection illuminator 3A and subsequently executes four imaging processes under the second patterned light having different phases with changing the phase of the second patterned light radiated from the second upper face inspection illuminator 3B, so as to obtain a total of eight different image data.

Similarly, in inspection with regard to each inspection range on the lower face side of the printed circuit board 1, the inspection routine of one or more embodiments of the present invention executes an image obtaining process that executes four imaging processes under the first patterned light having different phases with changing the phase of the first patterned light radiated from the first lower face inspection illuminator 4A and subsequently executes four imaging processes under the second patterned light having different phases with changing the phase of the second patterned light radiated from the second lower face inspection illuminator 4B, so as to obtain a total of eight different image data.

The flows of the image obtaining processes with regard to the respective inspection ranges on the upper face side and with regard to the respective inspection ranges on the lower face side of the printed circuit board 1 (image obtaining processes of obtaining eight different image data) according to one or more embodiments of the present invention are respectively similar to the flow of the image obtaining process with regard to the respective inspection ranges on the lower face side of the printed circuit board 1 according to the embodiments described above, and their detailed description is omitted.

The controller 6 then executes three-dimensional measurement (height measurement) of the solder paste 57 by the known phase shift method, based on the four different image data taken under each of the patterned lights on the upper face side and on the lower face side of the printed circuit board 1 and stores the results of measurement into the calculation result storage device 25.

The controller 6 subsequently executes a quality determination process of the solder paste 57 printed on each of the lands 53 on the upper face side of the printed circuit board 1 and executes a quality determination process of the solder paste 57 filled in each of the through holes 55 on the lower face side of the printed circuit board 1, based on the results of three-dimensional measurement.

When the state of the solder paste 57 is determined as "good quality" with regard to all the lands 53 on the upper face and all the through holes 55 on the lower face of the printed circuit board 1, the printed circuit board 1 is determined as a "non-defective". When the state of the solder paste 57 is determined as "poor quality" with regard to even one of the lands 53 or even one of the through holes 55, the printed circuit board 1 is determined as a "defective" on the whole.

As described above in detail, the configuration of one or more embodiments of the present invention has similar functions and advantageous effects to those of the embodiments described above. One or more embodiments of the present invention additionally execute inspection on the surface side of the printed circuit board 1. This allows for comprehensive quality determination based on the two-face inspection and further improves the inspection accuracy.

For example, in the case of a strong pressure of the squeegee 92 or in the case of a large attack angle of the squeegee 92 in the solder printing machine P12, a leading end of the squeegee 92 enters the opening 90$a$ of the screen mask 90 to wipe out the filled solder paste 57. This makes it likely that the amount of the solder paste 57 mounted on the land 53 on the surface side of the printed circuit board 1 becomes insufficient. In such a case, even when the printed circuit board 1 is determined as a non-defective by inspection on the rear face side of the printed circuit board 1, the configuration of one or more embodiments of the present invention allows the printed circuit board 1 to be determined as a defective by inspection on the surface side of the printed circuit board 1. This configuration can thus comprehensively handle the printed circuit board 1 as a defective.

In the case of a weak pressure of the squeegee 92 or in the case of a small attack angle of the squeegee 92, on the contrary, there is an insufficient force of pressing the solder paste 57 into the opening 90$a$ of the screen mask 90. This makes it likely that the amount of the solder paste 57 filled in the through hole 55 becomes insufficient and that the solder paste 57 does not sufficiently reach the rear face side of the printed circuit board 1, while an amount of the solder paste 57 enough to compensate for the deficiency is likely to be present on the surface side. In such a case, even when the printed circuit board 1 is determined as a defective by inspection on the rear face side of the printed circuit board 1, the configuration of one or more embodiments of the present invention allows the printed circuit board 1 to be determined as a non-defective by inspection on the surface side of the printed circuit board 1. This configuration can thus comprehensively handle the printed circuit board 1 as a non-defective.

In the production line P10 of the printed circuit board 1 configured to mount the two different types of electronic components, i.e., the surface mounting components and the insertion components 60 like one or more embodiments, using the solder printing inspection device P13 of one or more embodiments enables a solder printing portion with regard to the surface mounting component to be inspected simultaneously. There is accordingly no need to separately provide a solder printing inspection device for the surface mounting components. Additionally, the configuration of one or more embodiments enables a soldering process of the surface mounting component and a soldering process of the insertion component to be executed simultaneously by the reflow process (reflow device P15). As a result, this contributes to simplify the production process and to improve the productivity.

The present invention is not limited to the description of the above embodiments but may be implemented, for example, by configurations described below. The present invention may also be naturally implemented by applications and modifications other than those illustrated below.

(a) According to the embodiments described above, in the production line P10 of the printed circuit board 1 configured to mount only the insertion component 60, the solder printing inspection device (single-side inspection device) P13 is employed to inspect the printed circuit board 1 only on the lower face side (non-printing face side).

This configuration is, however, not essential. According to a modification, in the production line P10 of the printed circuit board 1 configured to mount only the insertion component 60, the solder printing inspection device (two-side inspection device) P13 like the above embodiments may be provided to inspect the printing state of the solder paste 57 on both the surface and the rear face of the printed circuit board 1.

(b) According to the embodiments described above, in the production line P10 of the printed circuit board 1 configured to mount the two different types of electronic components, i.e., the surface mounting components and the insertion components 60, the solder printing inspection device (two-side inspection device) P13 is employed to inspect the printed circuit board 1 on both the surface side and the rear face side.

This configuration is, however, not essential. According to a modification, in the production line P10 of the printed circuit board 1 configured to mount the two different types of electronic components, i.e., the surface mounting components and the insertion components 60, for example, the solder printing inspection device P13 of the above embodiments for insertion mounting (for the rear face side) may be provided separately from a conventional solder printing inspection device for surface mounting (for the surface side).

(c) The embodiments described above are configured such that the lands 53 on the surface and on the rear face of the printed circuit board 1 are not electrically connected with each other in each of the through holes 55. This configuration is, however, not essential. A modification may be configured such that the lands 53 on the surface and the rear face of the printed circuit board 1 are electrically connected with each other by, for example, plating the inside of the through hole 55.

(d) The embodiments described above are configured to obtain the four different image data having the phase of each patterned light differing by 90 degrees each in three-dimensional measurement by the phase shift method. The frequency of phase shift and the amount of phase shift are not limited to those of the above embodiments. Another frequency of phase shift and another amount of phase shift may be employed as long as they allow for three-dimensional measurement by the phase shift method.

For example, one modification may be configured to execute three-dimensional measurement by obtaining three different image data having the phase differing by 120 degrees (or 90 degrees) each. Another modification may be configured to execute three-dimensional measurement by obtaining two different image data having the phase differing by 180 degrees (or 90 degrees) each.

(e) The embodiments described above are configured to execute three-dimensional measurement by the phase shift method. This technique is, however, not essential, but another three-dimensional measurement technique such as a light sectioning method or a spatial coding method may be employed alternatively.

(f) The embodiments described above are configured to execute the good/poor quality determination of the solder paste 57 by calculating the volume of the solder paste 57 protruded from the reference plane, comparing the volume data with the reference data and determining whether the result of comparison is within the allowable range. The good/poor quality determination of the solder paste 57 is, however, not limited to this configuration.

For example, a modification may be configured to execute the good/poor quality determination of the solder paste 57 by determining whether the protrusion length of the solder paste 57 from the through hole 55 (peak height or average height) is equal to or longer than a predetermined length.

(g) The embodiments described above are configured to execute three-dimensional measurement by irradiating the printed circuit board 1 with the patterned lights for inspection of the printed circuit board 1. A modification may be configured to execute two-dimensional measurement in place of or in addition to the three-dimensional measurement.

For example, according to one modification, the lower face inspection unit 4 may be configured to include an illuminator for two-dimensional inspection, in addition to the first lower face inspection illuminator 4A, the second lower face inspection illuminator 4B and the lower face inspection camera 4C. According to another modification, the lower face inspection unit 4 may be configured with omission of the first lower face inspection illuminator 4A and the second lower face inspection illuminator 4B to execute only two-dimensional measurement without executing three-dimensional measurement. In the aforementioned embodiments, the similar configuration may be employed with regard to the upper face inspection unit 3.

In the case of inspection by two-dimensional measurement, for example, when the size (area) of the solder paste 57 in a through hole 55 is smaller than the size (area) of the opening of the through hole 55 in planar view of the lower face side (non-printing face side) of the printed circuit board 1, the solder paste 57 in the through hole 55 may be determined as poor quality.

(h) The embodiments described above are configured to successively move the lower face inspection unit 4 to the plurality of inspection ranges set on the lower face of the printed circuit board 1 and execute inspection with regard to the respective inspection ranges, so as to implement inspection of the entire lower face of the printed circuit board 1. This configuration is, however, not essential. A modification may be configured to successively convey the printed circuit board 1 and inspect the printed circuit board 1 while the lower face inspection unit 4 is fixed (the same applies to the upper face inspection unit 3 in the aforementioned embodiments).

(i) The embodiments described above are configured such that the rear face (non-printing face) side of the printed circuit board 1 is arranged to face down and that the printing state of the solder paste 57 in the through hole 55 is inspected from the lower side. This configuration is, however, not essential. A modification may be configured such that the rear face (non-printing face) side of the printed circuit board 1 is arranged to face up and that the printing state of the solder paste 57 in the through hole 55 is inspected from the upper side.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1 . . . printed circuit board, 2 . . . conveyance mechanism, 4 . . . lower face inspection unit, 4A . . . first lower face inspection illuminator, 4B . . . second lower face inspection illuminator, 4C . . . lower face inspection camera, 6 . . . controller, 53 . . . land, 55 . . . through hole, 57 . . . solder paste, 60 . . . insertion component, 60a . . . lead terminal, P13 . . . solder printing inspection device

The invention claimed is:

1. A solder printing inspection device that inspects a printing state of solder paste printed on a substrate having a through hole into which a lead terminal of an insertion component is inserted, the solder printing inspection device comprising:
a non-printing face side illuminator that comprises:
a first non-printing face side light source that emits a first predetermined light in a first direction and irradiates an inspection range on a non-printing face; and
a second non-printing face side light source that emits a second predetermined light same as the first predetermined light, in a second direction different from the first direction, and irradiates the inspection range on the non-printing face,
wherein the non-printing face is opposite to a printing face on which the solder paste is printed, out of a surface and a rear face of the substrate;
a non-printing face side camera that takes an image of the inspection range on the non-printing face irradiated with the first and second predetermined light; and
a controller that executes inspection with regard to the solder paste filled in the through hole within the inspection range, based on image data with regard to the inspection range on the non-printing face taken by the non-printing face side camera, wherein
the non-printing face side illuminator radiates first and second light for three-dimensional measurement as the first and second predetermined light, and
the controller:
executes three-dimensional measurement of the solder paste, based on image data taken by the non-printing face side camera with the first and second light for three-dimensional measurement; and
executes good/poor quality determination of the solder paste, based on a measurement value obtained by the three-dimensional measurement, and determines the solder paste as good quality when an amount of the solder paste in a portion protruded from the through hole is equal to or greater than a predetermined amount.

2. A solder printing inspection device that inspects a printing state of solder paste printed on a substrate having a through hole into which a lead terminal of an insertion component is inserted, the solder printing inspection device comprising:

a non-printing face side illuminator that comprises:
- a first non-printing face side light source that emits a first predetermined light in a first direction and irradiates an inspection range on a non-printing face; and
- a second non-printing face side light source that emits a second predetermined light same as the first predetermined light, in a second direction different from the first direction, and irradiates the inspection range on the non-printing face,
- wherein the non-printing face is opposite to a printing face on which the solder paste is printed, out of a surface and a rear face of the substrate;

a non-printing face side camera that takes an image of the inspection range on the non-printing face irradiated with the first and second predetermined light;

a printing face side illuminator that comprises:
- a first printing face side light source that emits a third predetermined light in a third direction and irradiates an inspection range on a printing face; and
- a second printing face side light source that emits a fourth predetermined light same as the third predetermined light, in a fourth direction different from the third direction, and irradiates the inspection range on the printing face, a printing face side camera that takes an image of the inspection range on the printing face irradiated with the third and fourth predetermined light; and a controller that executes inspection with regard to the solder paste filled in the through hole within the inspection range, based on image data with regard to the inspection range on the non-printing face taken by the non-printing face side camera, and executes inspection with regard to the solder paste in the inspection range, based on image data with regard to the inspection range on the printing face taken by the printing face side camera, wherein the non-printing face side illuminator radiates first and second light for three-dimensional measurement as the first and second predetermined light, and the controller:
- executes three-dimensional measurement of the solder paste, based on image data taken by the non-printing face side camera with the first and second light for three-dimensional measurement; and
- executes good/poor quality determination of the solder paste, based on a measurement value obtained by the three-dimensional measurement, and determines the solder paste as good quality when an amount of the solder paste in a portion protruded from the through hole is equal to or greater than a predetermined amount.

3. The solder printing inspection device according to claim 1,
wherein the non-printing face faces down,
the non-printing face side illuminator irradiates the substrate from a lower side with the first and second predetermined light, and
the non-printing face side camera takes an image from the lower side of the substrate.

4. The solder printing inspection device according to claim 2,
wherein the non-printing face faces down,
the non-printing face side illuminator irradiates the substrate from a lower side with the first and second predetermined light, and
the non-printing face side camera takes an image from the lower side of the substrate.

* * * * *